United States Patent
Yoon et al.

(10) Patent No.: US 11,594,569 B2
(45) Date of Patent: Feb. 28, 2023

(54) THIN FILM TRANSISTOR ARRAY SUBSTRATE FOR DIGITAL X-RAY DETECTOR DEVICE AND DIGITAL X-RAY DETECTOR DEVICE INCLUDING THE SAME

(71) Applicant: LG Display Co., Ltd., Seoul (KR)

(72) Inventors: Jaeho Yoon, Gyeongsangbuk-do (KR); Moonsoo Kang, Daegu (KR); Donghyeon Jang, Jinju-si (KR); Shihyung Park, Daegu (KR)

(73) Assignee: LG DISPLAY CO., LTD., Seoul (KR)

(*) Notice: Subject to any disclaimer, the term of this patent is extended or adjusted under 35 U.S.C. 154(b) by 22 days.

(21) Appl. No.: 17/102,410

(22) Filed: Nov. 23, 2020

(65) Prior Publication Data

US 2021/0175273 A1 Jun. 10, 2021

(30) Foreign Application Priority Data

Dec. 6, 2019 (KR) .................. 10-2019-0161894

(51) Int. Cl.
| | |
|---|---|
| *H01L 27/12* | (2006.01) |
| *H01L 27/146* | (2006.01) |
| *H01L 31/115* | (2006.01) |
| *H01L 31/105* | (2006.01) |
| *H04N 5/374* | (2011.01) |

(52) U.S. Cl.
CPC .... *H01L 27/14658* (2013.01); *H01L 27/1214* (2013.01); *H01L 31/1055* (2013.01); *H01L 31/115* (2013.01); *H04N 5/3741* (2013.01)

(58) Field of Classification Search
CPC ................. H01L 27/14658; H04N 5/3741
See application file for complete search history.

(56) References Cited

U.S. PATENT DOCUMENTS

| | | | | |
|---|---|---|---|---|
| 2014/0118584 | A1* | 5/2014 | Lee | H04N 9/04557 348/262 |
| 2014/0361180 | A1* | 12/2014 | Fujimura | H01L 27/14612 250/366 |
| 2017/0084665 | A1* | 3/2017 | Caris | H01L 27/14689 |
| 2017/0092673 | A1* | 3/2017 | Miyamoto | H01L 27/14609 |

FOREIGN PATENT DOCUMENTS

| | | | |
|---|---|---|---|
| JP | 2013156119 A | * | 8/2013 |
| KR | 10-1035349 B1 | | 5/2011 |
| KR | 10-2016-0054102 A | | 5/2016 |
| KR | 10-1674207 B1 | | 11/2016 |
| KR | 10-2019-0079355 A | | 7/2019 |
| KR | 10-2019-0079417 A | | 7/2019 |

* cited by examiner

*Primary Examiner* — David P Porta
*Assistant Examiner* — Mamadou Faye
(74) *Attorney, Agent, or Firm* — Polsinelli PC

(57) ABSTRACT

A thin film transistor array substrate for a digital X-ray detector device including a base substrate; a plurality of data lines and a plurality of gate lines disposed on the base substrate and arranged to cross each other; a driving thin film transistor disposed above the base substrate and including a first electrode, a second electrode, a gate electrode and an active layer; a PIN diode connected to the driving thin film transistor; and at least one shielding layers disposed above the driving thin film transistor and configured to overlay the active layer, wherein the at least one shielding layers are electrically connected to the plurality of data lines.

20 Claims, 6 Drawing Sheets

THIN FILM TRANSISTOR ARRAY SUBSTRATE FOR DIGITAL X-RAY DETECTOR DEVICE AND DIGITAL X-RAY DETECTOR DEVICE INCLUDING THE SAME

CROSS-REFERENCE TO RELATED APPLICATION

The present disclosure claims priority to and the benefit of Korean Patent Application No. 10-2019-0161894, filed on Dec. 6, 2019, which is hereby incorporated by reference in its entirety.

BACKGROUND

Field of the Disclosure

The present disclosure relates to a thin film transistor array substrate for a digital X-ray detector device capable of minimizing a negative shift phenomenon of a threshold voltage of an element and the digital X-ray detector device including the same.

Description of the Background

Because X-ray is of a short wavelength, the X-ray may pass through an object easily. The transmittance of the X-ray depends on an inner density of the object. Therefore, an internal structure of the object may be observed by detecting an amount of the X-ray transmitted through the object.

One of X-ray based inspection methods used in a medical field is a film printing scheme. However, in the film printing scheme, in order to check a result, an image is shot, and then a film is printed. Thus, it takes a long time to check the result. Especially, in the film printing scheme, there are some difficulties in storing and preserving the printed film.

A digital X-ray detector (DXD) device using a thin film transistor has been developed and widely used in the medical field.

The DXD device detects the transmittance of the X-ray transmitted through the object and displays an internal state of the object on a display based on the transmittance.

Therefore, the digital X-ray detector device may display the internal structure of the object without using an additional film and printed paper. Further, the DXD device may check the results in real time immediately after X-ray photographing.

A digital X-ray detector device detects current inside a digital X-ray detection panel to implement an image based on the current and includes a photo PIN (P type semiconductor-Intrinsic type semiconductor-N type semiconductor) diode that responds to light and a driving thin film transistor that drives the photo PIN diode.

In some examples, the driving thin film transistor may use an element having a high mobility such that the driving thin film transistor implements the image.

When X-rays are irradiated to the digital X-ray detector device, X-rays may be absorbed into an active layer of the driving thin film transistor element, and thus, a negative shift phenomenon of a threshold voltage of the element having the high mobility is significantly generated.

The negative shift phenomenon of the threshold voltage of the element is significantly generated in the element, which results in a defect of the element.

SUMMARY

Accordingly, the present disclosure provides a thin film transistor array substrate for a digital X-ray detector device capable of minimizing the negative shift phenomenon of the threshold voltage of the element and a digital X-ray detector device including the same.

In addition, the present disclosure provides a thin film transistor array substrate for a digital X-ray detector device and the digital X-ray detector device capable of minimizing exposure of a driving thin film transistor element to X-rays.

The present disclosure further provides a thin film transistor array substrate for a digital X-ray detector device and the digital X-ray detector device capable of minimizing the negative shift phenomenon of the threshold voltage of the driving thin film transistor element.

The present disclosure is not limited to the above-mentioned features, and other advantages of the present disclosure, which are not mentioned, may be understood by the following description, and more clearly understood by the aspects of the present disclosure. It is also readily understood that the objects and the advantages of the present disclosure may be implemented by features described in appended claims and a combination thereof.

According to an aspect of the present disclosure, there is provided a thin film transistor array substrate for a digital X-ray detector device and the digital X-ray detector device capable of minimizing exposure of the driving thin film transistor element to X-rays and minimizing the negative shift phenomenon of the threshold voltage of the element.

According to an aspect of the present disclosure, the thin film transistor array substrate for the digital X-ray detector device and the digital X-ray detector device include a base substrate, a plurality of data lines and a plurality of gate lines on the base substrate and arranged to cross each other, a driving thin film transistor disposed on or above the base substrate, the driving thin film transistor including a first electrode, a second electrode, a gate electrode, and an active layer, and a PIN diode connected to the driving thin film transistor.

In this case, at least one shielding layer is disposed above the driving thin film transistor to overlay an active layer and the at least one shielding layer is electrically connected to the data line.

A (+) voltage may be applied to each of the shielding layers electrically connected to the data line.

A gate electrode may be disposed below the active layer and the shielding layer may be disposed above the active layer. The at least one insulating layer may be disposed between the plurality of shielding layers. Accordingly, the plurality of shielding layers may be spaced apart from one another not to directly contact one another.

In this case, the shielding layer disposed closest to the driving thin film transistor may be electrically connected to the data line and the shielding layers may be electrically connected to one another.

According to the present disclosure, at least one shielding layer is disposed above the driving thin film transistor to overlay the active layer and the shielding layer prevents direct irradiation of X-rays to the active layer to minimize the exposure of the driving thin film transistor element to X-rays.

In addition, according to the present disclosure, the at least one shielding layer is electrically connected to the data line and the (+) voltage is applied to the at least one shielding layer to restore the threshold voltage to an original state, which has been negatively shifted by the driving thin film transistor element based on the exposed X-rays.

Specific effects of the present disclosure, in addition to the above-mentioned effects, will be described together while describing specific matters to implement the present disclosure.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
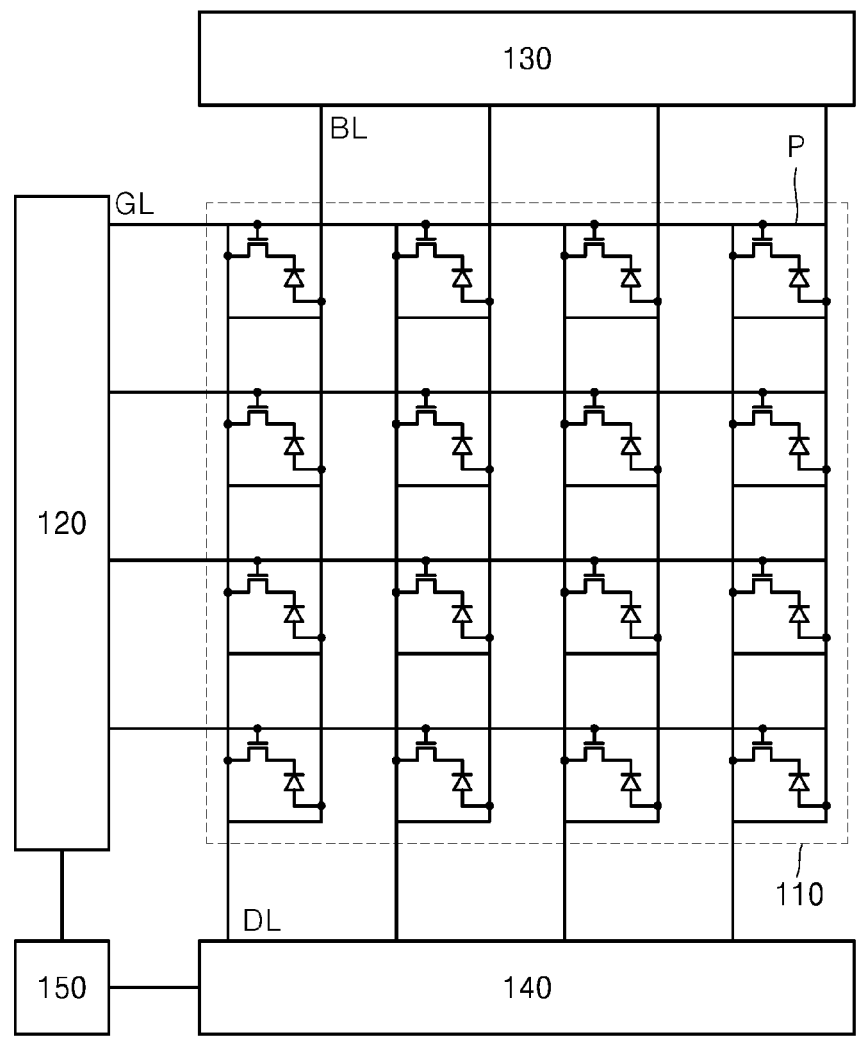
FIG. 1 is a schematic block diagram showing an example digital X-ray detector device in the present disclosure.

Some aspects of the present disclosure are described in detail with reference to the accompanying drawings. Accordingly, the skilled person in the art to which the present disclosure pertains may easily implement the technical idea of the present disclosure. In the description of the present disclosure, if it is determined that a detailed description of a well-known technology relating to the present disclosure may be omitted if it unnecessarily obscures the gist of the present disclosure. One or more aspects of the present disclosure are described in detail with reference to the accompanying drawings. In the drawings, same reference numerals may be used to refer to same or similar components.

In this document, the terms "upper," "lower," "on," "under," or the like are used such that, where a first component is arranged at "an upper portion" or "a lower portion" of a second component, the first component may be arranged in contact with the upper surface (or the lower surface) of the second component, or another component may be disposed between the first component and the second component. Similarly, where a first component is arranged on or under a second component, the first component may be arranged directly on or under (in contact with) the second component, or one or more other components may be disposed between the first component and the second component.

Further, the terms "connected," "coupled," or the like are used such that, where a first component is connected or coupled to a second component, the first component may be directly connected or able to be connected to the second component, or one or more additional components may be disposed between the first and second components, or the first and second components may be connected or coupled through one or more additional components.

Hereinafter, a thin film transistor array substrate for a digital X-ray detector device according to some aspects of the present disclosure and a digital X-ray detector device including the same are described.

FIG. 1 is a schematic block diagram showing a digital X-ray detector device. The digital X-ray detector device may include a thin film transistor array 110, a gate driver 120, a bias supply 130, a readout circuitry 140, and a timing controller 150.

The thin film transistor array 110 may include a plurality of cell regions defined by a plurality of gate lines GL arranged in a first direction and by a plurality of data lines DL arranged in a second direction orthogonal to the first direction.

The cell regions are arranged in a matrix configuration. Each cell region may include a pixel region in which photo-sensitive pixels Ps are formed. The thin film transistor array 110 may detect the X-ray emitted from an X-ray source, may convert the detected X-ray into an electrical signal, and may output the electrical signal.

Each photo-sensitive pixel may include a PIN diode which converts light of a visible light region converted from the X-ray by a scintillator into an electronic signal and outputs the electronic signal and a thin film transistor TFT that transmits a detected signal output from the PIN diode to a readout circuitry 140. A first end of the PIN diode may be connected to the thin film transistor and a second end thereof may be connected to a bias line BL.

A gate electrode of the thin film transistor may be connected to the gate line GL which carries a scan signal. Source/drain electrodes of the thin film transistor may be respectively connected to the PIN diode and a data line DL which carries the detected signal output from the PIN diode. Each bias line BL may extend in a parallel manner to each data line DL.

The gate driver 120 may sequentially apply gate signals to thin film transistors of photo-sensitive pixels through the gate lines GLs. The thin film transistors of the photo-sensitive pixels may be turned on in response to the gate signals having a gate-on voltage level.

The bias supply 130 may apply driving voltages to the photo-sensitive pixels through the bias lines BL. The bias supply 130 may selectively apply a reverse bias or a forward bias to the PIN diode.

The readout circuitry 140 may read out the detected signal received from the thin film transistor turned on in response to the gate signal of the gate driver. For example, the detected signal output from the PIN diode may be input to the readout circuitry 140 through the thin film transistor and the data line DL.

The readout circuitry 140 may have an offset readout period for which an offset image is read out and an X-ray readout period for which the detected signal after an X-ray exposure is read out and may read out the detection signal output from the photo-sensitive pixels during the X-ray readout period.

The readout circuitry 140 may include a signal detector and a multiplexer. The signal detector includes a plurality of amplification circuits that correspond respectively to the data lines DL. Each amplification circuit may include an amplifier, a capacitor, and a reset element.

The timing controller 150 may control an operation of the gate driver 120 by generating a start signal and a clock signal and supplying each of the start signal and the clock signal to the gate driver 120. Further, the timing controller 150 may control an operation of the readout circuitry 140 by generating a readout control signal and a readout clock signal and supplying each of the readout control signal and the readout clock signal to the readout circuitry 140.

Figure 2:
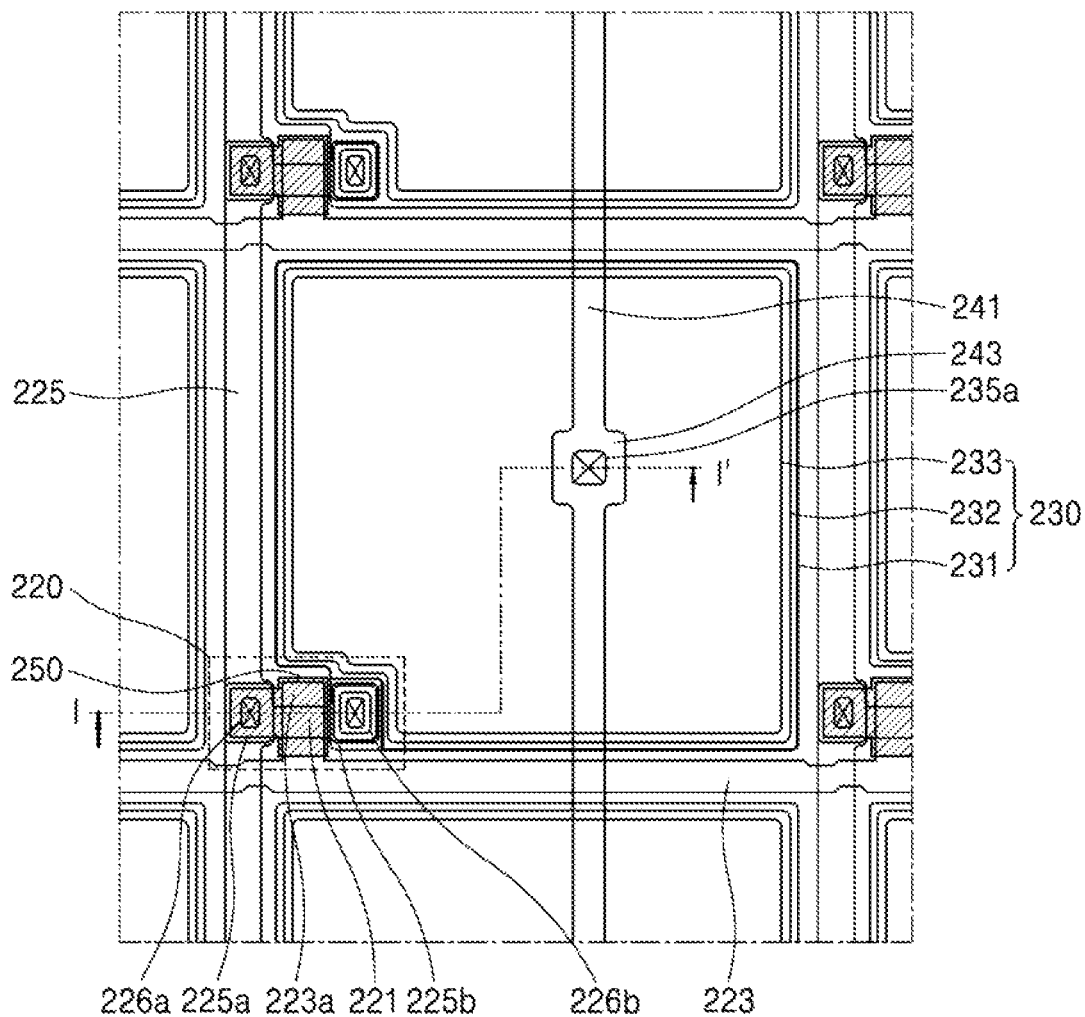
FIG. 2 is a plan view showing an example area of a digital X-ray detector device in the present disclosure.
Figure 3:
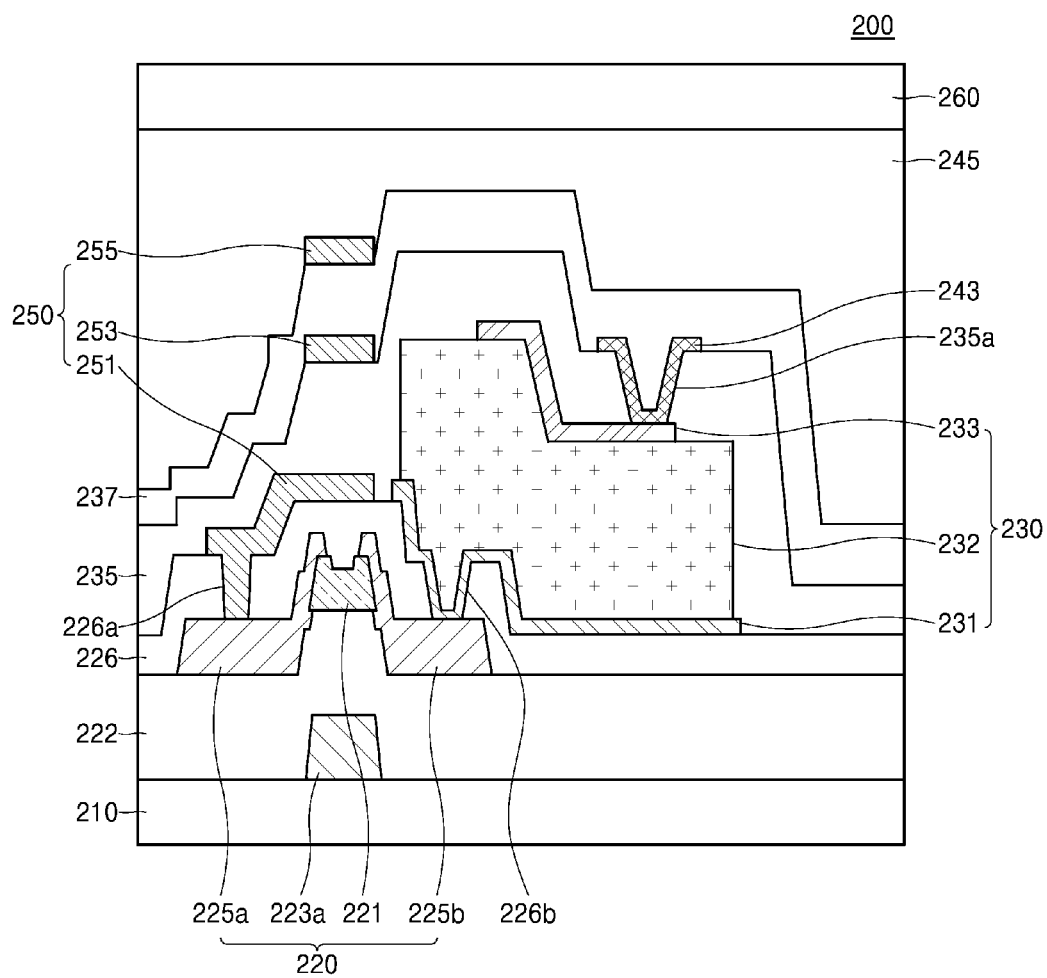
FIG. 3 is a cross-sectional view showing an example area taken along line I-I' of a digital X-ray detector device in the present disclosure.
Figure 4:
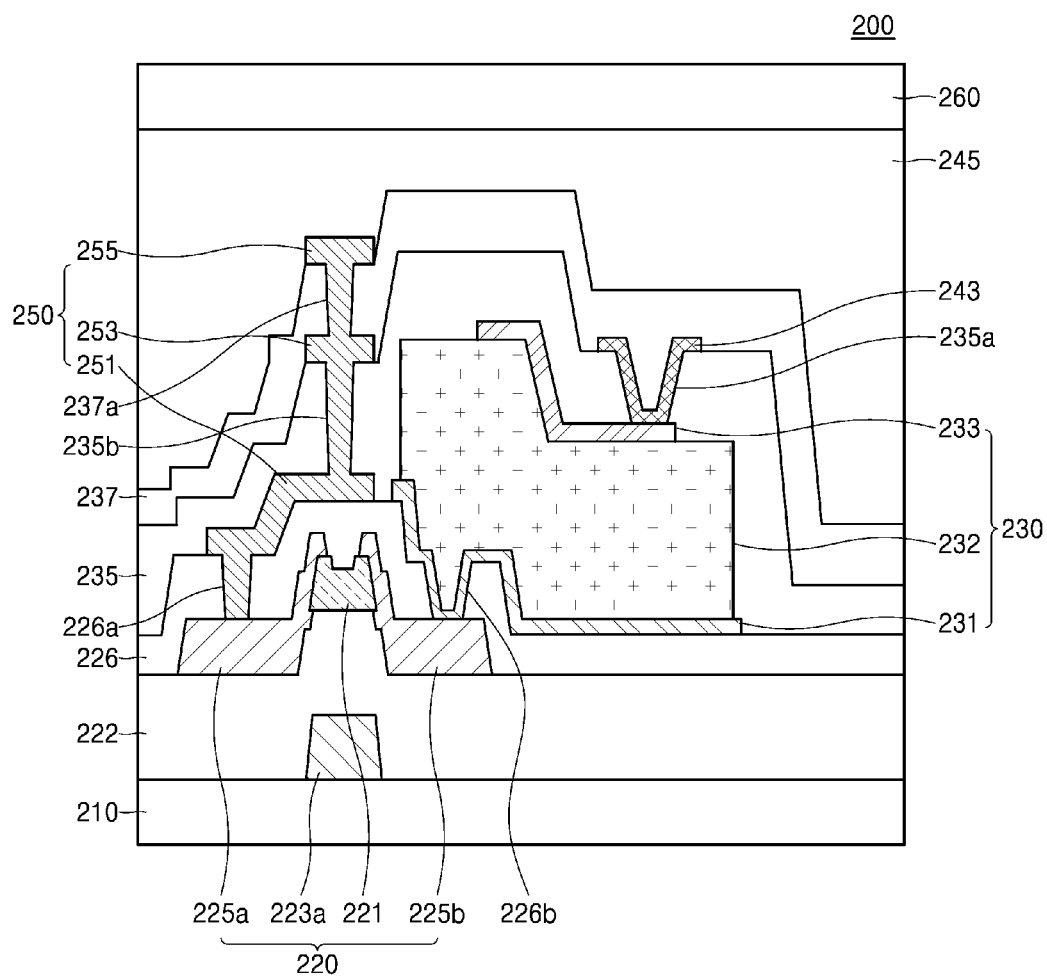
FIG. 4 is a cross-sectional view showing an example area taken along line I-I' of a digital X-ray detector device in the present disclosure.

Hereinafter, a digital X-ray detector device according to one aspect of the present disclosure is described in detail with reference to FIG. 2 to FIG. 4.

A digital X-ray detector 200 according to one aspect of the present disclosure includes a base substrate 210.

The base substrate 210 may be embodied as a glass substrate made of glass, but is not limited thereto. In some cases where the base substrate 210 is used for a flexible digital X-ray detector device, a substrate made of polyimide material and having flexible properties may be used as an example of the base substrate 210.

On the base substrate 210, a plurality of cell regions are defined by a plurality of gate lines 223 and a plurality of data lines 225 intersecting with each other in an orthogonal manner. Each pixel may correspond to each cell region to define a plurality of pixel regions. A region corresponding to the gate line 223 and the data line 225 may be defined as a boundary region between pixel regions.

Each pixel includes the thin film transistor 220 and the PIN diode 230. The plurality of thin film transistors 220 and the plurality of PIN diodes 230 may be disposed on an array substrate having the plurality of pixel regions. The thin film transistor 220 and the PIN diode 230 of the pixel are described below and this configuration may also be applied to adjacent pixels unless otherwise specified.

A thin film transistor 220 including a first electrode 225a, a second electrode 225b, a gate electrode 223a, and an active layer 221 is disposed on or above the base substrate 210.

A buffer layer may be disposed between the base substrate 210 and the thin film transistor 220. In this case, the buffer layer may be made of an inorganic material such as silicon oxide (SiOx) or silicon nitride (SiNx) and may be provided as a multi-buffer layer composed of multiple sub-layers.

The gate electrode 223a may be disposed on the base substrate. The gate electrode 223a may be made of one selected from a group consisting of molybdenum (Mo), aluminum (Al), chromium (Cr), gold (Au), titanium (Ti), nickel (Ni), copper (Cu), and alloy thereof and may include a single layer or multiple layers.

The gate electrode 223a may extend from a gate line 223. The gate line 223 and the gate electrode 223a may be integrated with each other such that the gate electrode 223a is disposed in the gate line 223. Accordingly, the gate line 223 and the gate electrode 223a may be disposed on the same layer.

The gate insulation layer 222 may be disposed on the gate electrode 223a and the active layer 221 may be disposed on the gate insulation layer 222.

The active layer 221 may be made of an oxide semiconductor material such as indium gallium zinc oxide (IGZO), but is not limited thereto, and may be made of low temperature polycrystalline silicon (LTPS) or amorphous silicon (a-Si).

The first electrode 225a may be disposed on the active layer 221 to be connected to a first end of the active layer 221. The second electrode 225b may be disposed on the active layer 221 to be connected to a second end of the active layer 221.

In this case, the first electrode 225a may bed branched from the data line 225 and may be electrically connected by an additional connection electrode connecting the data line 225 to the first electrode 225a.

The data line 225 may be made of, but is not limited to, one selected from a group consisting of molybdenum (Mo), aluminum (Al), chromium (Cr), gold (Au), titanium (Ti), nickel (Ni), copper (Cu) and alloys thereof.

The second electrode 225b may be a source electrode connected to the PIN diode 230 and the first electrode 225a may be a drain electrode, but is not limited thereto, and the positions of the source region and the drain region may be interchanged.

A first passivation layer 226 as an insulating layer may be disposed above the active layer 221 and on each of the first electrode 225a and the second electrode 225b. The first passivation layer 226 may made of an inorganic material such as silicon oxide (SiOx) or silicon nitride (SiNx), but is not limited thereto.

A shielding layer 250 and a lower electrode 231 of the PIN diode 230 may be disposed on or above the first passivation layer 226.

In some examples, the shielding layer 250 may include one or more shielding layers, for example, a first shielding layer 251, a second shielding layer 253, and a third shielding layer 255, and the first shielding layer 251 may be disposed on the first passivation layer 226.

The shielding layer 250 may be made of metal having conductivity and blocking X-rays and may be made of the same material as each of a gate line 223, a data line 225, and a bias line 241, but is not limited thereto.

The first shielding layer 251 overlays the active layer 221 of the driving thin film transistor 220 to block direct absorption of the X-rays into the active layer 221 when the X-rays are irradiated, thereby minimizing an influence on the driving thin film transistor 220 by the X-rays.

In some examples, the first shielding layer 251 may have a greater area than that of the active layer 221 to completely overlay the active layer 221 to thereby minimize the exposure of the active layer 221 to X-rays.

In some cases where X-rays are irradiated to and absorbed into the active layer 221, a phenomenon may occur in which a threshold voltage Vth of the driving thin film transistor 220 is negatively shifted. However, the first shielding layer 251 may block the direct irradiation of the X-rays directly to the active layer 221, thereby minimizing the negative shift phenomenon of the threshold voltage.

In addition, according to the present disclosure, the first shielding layer 251 of the shielding layer 250 is electrically connected to the data line 225. In this case, the first shielding layer 251 may be directly connected to the data line 225 and may be electrically connected to the data line 225 through the first electrode 225a.

For example, the first shielding layer 251 is connected to the first electrode 225a through a first contact hole 226a and the first electrode 225a is connected to the data line 225 such that the first shielding layer 251 and the data line 225 may be electrically connected to each other.

A (+) voltage may be applied to the first shielding layer 251 electrically connected to the data line 225.

For example, the gate electrode 223a is disposed below the active layer 221 to function as a lower gate electrode and the first shielding layer 251 is disposed above the active layer 221 to function as an upper gate electrode.

When the (+) voltage is applied to the first shielding layer 251 above the active layer 221, the threshold voltage shifted in a (−) voltage direction may be restored to the voltage before negative shifting to minimize occurrence of the negative shift of the threshold voltage.

The PIN diode 230 is disposed on or above the first passivation layer 226. The PIN diode 230 is connected to the lower thin film transistor 220. The PIN diode 230 may be disposed in the pixel region.

The PIN diode 230 may include a lower electrode 231 connected to the thin film transistor 220, a PIN layer 232 on the lower electrode 231, and an upper electrode 233 on the PIN layer 232.

The lower electrode 231 may serve as a pixel electrode in the PIN diode 230. The lower electrode 231 may be made of an opaque metal such as molybdenum Mo or at least one of transparent oxides such as indium tin oxide (ITO), indium zinc oxide (IZO), and zinc oxide (ZnO), depending on characteristics of the PIN diode 230.

The lower electrode 231 may be connected to the second electrode 225b of the thin film transistor 220 via a second contact hole 226b as a contact hole in the first passivation layer 226, such that the thin film transistor 220 may be connected to the PIN diode 230.

The PIN layer 232 may be disposed on the lower electrode 231 to convert a visible light, which has been converted from the X-ray, into an electrical signal. In this connection, a scintillator may convert the X-ray into the visible light.

The PIN layer 232 may be formed by sequentially stacking, on the lower electrode 231, an N (Negative) type semiconductor layer containing N type impurities having a high concentration, an I (Intrinsic) type semiconductor layer, and a P (Positive) type semiconductor layer containing P type impurities.

The I-type semiconductor layer may be relatively thicker than each of the N-type semiconductor layer and the P-type semiconductor layer. The PIN layer 232 may be made of a material capable of converting the visible light into which the X-ray emitted from an X-ray source is converted into an electrical signal, for example, a-Se, HgI2, CdTe, PbO, PbI2, BiI3, GaAs, and Ge.

The upper electrode 233 may be disposed on the PIN layer 232. The upper electrode 233 may be made of at least one of transparent oxides such as indium tin oxide (ITO), indium zinc oxide (IZO), and zinc oxide (ZnO) and may improve a fill factor of the PIN diode 230.

A second passivation layer 235 may be disposed above the PIN diode 230. The second passivation layer 235 may be made of an inorganic material such as silicon oxide (SiOx) or silicon nitride (SiNx), but is not limited thereto. The second passivation layer 235 may cover up to a side surface of the PIN diode 230 to protect the side surface of the PIN diode 230 from moisture or other foreign substances.

A bias electrode 243 may be disposed on the second passivation layer 235 on the PIN diode 230. The bias electrode 243 may be connected to the upper electrode 233 of the PIN diode 230 via a third contact hole 235a as a contact hole in the second passivation layer 235 and may apply a bias voltage to the PIN diode 230.

The bias electrode 243 may be branched from a bias line 241 arranged in parallel to the data line 225.

In addition, a second shielding layer 253 of the shielding layer 250 may be disposed on the second passivation layer 235. The second shielding layer 253 may have a greater area than that of the active layer 221 to completely overlay the active layer 221, thereby minimizing the exposure of the active layer 221 to X-rays.

A third passivation layer 237, which is an insulating layer, may be disposed on each of the bias electrode 243 and the second shielding layer 253. The third passivation layer 237 may be made of an inorganic material such as silicon oxide (SiOx) or silicon nitride (SiNx), but is not limited thereto.

In addition, a third shielding layer 255 of the shielding layer 250 may be disposed on the third passivation layer 237. The third shielding layer 255 may have a greater area than that of the active layer 221 to completely overlay the active layer 221, thereby minimizing an exposure of the active layer 221 to X-rays.

At least one insulating layer may be disposed among the plurality of shielding layers 250. Accordingly, the plurality of shielding layers 250 may be spaced apart from one another not to directly contact one another.

In this case, the first shielding layer 251, which is disposed closest to the driving thin film transistor, is electrically connected to the data line 225 and the other shielding layers, for example, the second shielding layer 253 and the third shielding layer 255 may each have an island shape such that the second shielding layer 253 and the third shielding layer 255 may not be electrically connected to each other.

According to an aspect of the present disclosure, a plurality of shielding layers 250 are disposed above the active layer 221 to effectively obtain X-ray shielding effects.

In some examples, according to another aspect of the present disclosure, the plurality of shielding layers 250, for example, the first shielding layer 251, the second shielding layer 253, and the third shielding layer 255 may be electrically connected to one another.

For example, the first shielding layer 251 and the second shielding layer 253 may be electrically connected to each other via a fourth contact hole 235b in the second passivation layer 235 and the second shielding layer 253 and the third shielding layer 255 may be electrically connected to each other via a fifth contact hole 237a in the third passivation layer 237.

Therefore, as the first shielding layer 251, the second shielding layer 253, and the third shielding layer 255 are electrically connected to one another, the second shielding layer 253 and the third shielding layer 255 as well as the first shielding layer 251 are each electrically connected to the data line 225 to apply the (+) voltage to each of the first shielding layer 251, the second shielding layer 253, and the third shielding layer 255.

When the (+) voltage is applied to each of the first shielding layer 251, the second shielding layer 253, and the third shielding layer 255 above the active layer 221, the threshold voltage shifted in the (−) voltage direction may be restored to the voltage before negative shifting, to further minimize the occurrence of the negative shift phenomenon of the threshold voltage.

A planarization layer 245 may disposed on each of the third passivation layer 237 and the third shielding layer 255 to overlay a whole surface of the base substrate 210 including the PIN diode 230. The planarization layer 245 may be made of an organic material such as photo acryl (PAC), but is not limited thereto.

A scintillator layer 260 may be disposed on the planarization layer 245 to overlay the PIN diode 230.

In some examples, the scintillator layer 260 is disposed above each of the thin film transistor 220 and the PIN diode 230 to overlay each of the thin film transistor 220 and the PIN diode 230.

As the scintillator layer 260 may be directly deposited on the array substrate 210, the planarization of a lower surface of the scintillator layer 260 may be needed. Therefore, the planarization layer 245 is disposed to planarize the lower surface of the scintillator layer 260 to thereby facilitate the formation of the scintillator layer 260 by deposition of the scintillator.

The scintillator layer 260 may be grown in a vertical direction to have a plurality of columnar crystal phases, such that a plurality of scintillator columnar crystals may be arranged in a side-by-side manner, but is not limited thereto.

The scintillator may be made of a material such as cesium iodide (CsI), but is not limited thereto.

The digital X-ray detector 200 according to the present disclosure operates as follows.

X-ray is irradiated to the digital X-ray detector 200. The scintillator layer 260 converts the X-ray into the visible light. The PIN layer 232 of the PIN diode 230 converts the light in the visible region into an electronic signal.

For example, when the light in the visible region is irradiated to the PIN layer 232, the I-type semiconductor layer is depleted by each of the N-type semiconductor layer and the P-type semiconductor layer, thereby generating an electric field therein. Then, holes and electrons generated by the light drift based on the electric field and are collected into the P-type semiconductor layer and the N-type semiconductor layer, respectively.

The PIN diode 230 converts the light in the visible region into the electrical signal and transmits the electronic signal to the thin film transistor 220. The electrical signal thus transmitted is displayed as an image signal via the data line 225 connected to the thin film transistor 220.

According to an aspect of the present disclosure, it is possible to minimize the exposure of the driving thin film transistor to X-rays and the negative shift phenomenon of the threshold voltage of the element. This configuration is described below in detail.

A scintillator layer or a light conversion layer such as Gadox is attached to a digital X-ray detection panel including the thin film transistor array substrate for the digital X-ray detector device, and when the X-ray is irradiated, the light conversion layer converts the X-ray into a visible light.

In some examples, some of the irradiated X-rays are not converted into the visible light and may be directly irradiated to the digital X-ray detector panel.

The element such as the driving thin film transistor may be affected by some X-rays irradiated directly into the digital X-ray detector panel without passing through the light conversion layer, which results in deterioration.

Figure 5:
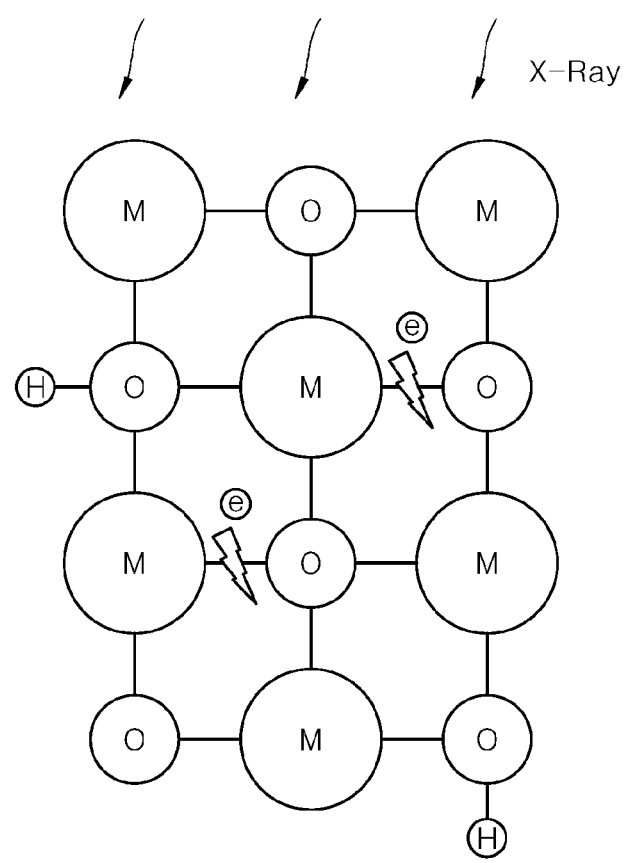
FIG. 5 shows a damage of an element due to X-rays.

For example, as shown in FIG. 5, in the case of the driving thin film transistor including an active layer made of an oxide semiconductor material, when the X-rays are irradiated, a bonding of metal (M) with oxygen (O) in an oxide film is broken, which results in oxygen deficiency, thereby shifting the threshold voltage of the element in the (−) direction.

In addition, in the case of the driving thin film transistor including the active layer made of low temperature polycrystalline silicon (LTPS), when the X-rays are irradiated, electrons (e) excited in a gate metal are trapped in grain boundaries to shift the threshold voltage of the element in the (−) direction.

When the threshold voltage of the driving thin film transistor element is negatively shifted, current flows through the digital X-ray detector device even when the driving thin film transistor is turned off, which results in the deterioration of the element.

According to the present disclosure, one or more X-ray shielding layers are disposed to overlay the active layer of the driving thin film transistor to thereby prevent the direct exposure of the element to X-rays and to prevent the element from being affected by X-rays, and in some examples, the plurality of shielding layers are disposed to effectively shield the X-rays, thereby minimizing an effect of X-rays.

In some examples, according to the present disclosure, the plurality of shielding layers are disposed to physically shield the irradiation of X-rays and each of the shielding layers is electrically connected to the data line to apply the (+) voltage, thereby minimizing the negative shift phenomenon of the threshold voltage.

When the driving thin film transistor is negatively shifted, an amount of current turned on at 0V is increased (than that of current turned on at 0V of the driving thin film transistor in which the negative shift is not generated).

An amount of current flowing based on the turn-on of the driving thin film transistor when the voltage is negatively shifted to the (−) voltage is transmitted to the data line and an electric field occurs based on a voltage generated due to the current transmitted to the data line.

In some examples, the driving thin film transistor in which the threshold voltage is negatively shifted is turned on at the (−) voltage, and thus, electrons flow to the data line based on the turn-on of the driving thin film transistor at the (−) voltage.

Then, electrons are gathered on the shielding layer electrically connected to the data line, to generate, the shielding layer, an electric field and apply a (+) voltage to the shielding layer.

In this case, the shielding layer to which the (+) voltage is applied is disposed above the active layer to restore the negative-shifted threshold voltage back to an original state.

Therefore, according to the present disclosure, even if the threshold voltage is negatively shifted, the negative-shifted threshold voltage may be restored by the shielding layer based on the (+) voltage being applied to the shielding layer electrically connected to the data line and disposed above the active layer, to minimize the occurrence of the negative shift phenomenon of the threshold voltage.

In a further aspect, to obtain the restoring effects in some cases where the negative shift phenomenon of the threshold voltage is significantly generated, the shielding layer is connected to an external signal wire to apply a high value of (+) voltage to effectively obtain the restoring effects.

In some examples, assuming the case where the pixel electrode extends to overlay the active layer, the current generated by the PIN diode may be greatly lost to degrade a performance of the digital X-ray detector device. Therefore, overlaying the active layer by the shielding layer connected to the data line according to the present disclosure may be more preferable than overlaying the active layer by the extending the pixel electrode.

Figure 6:
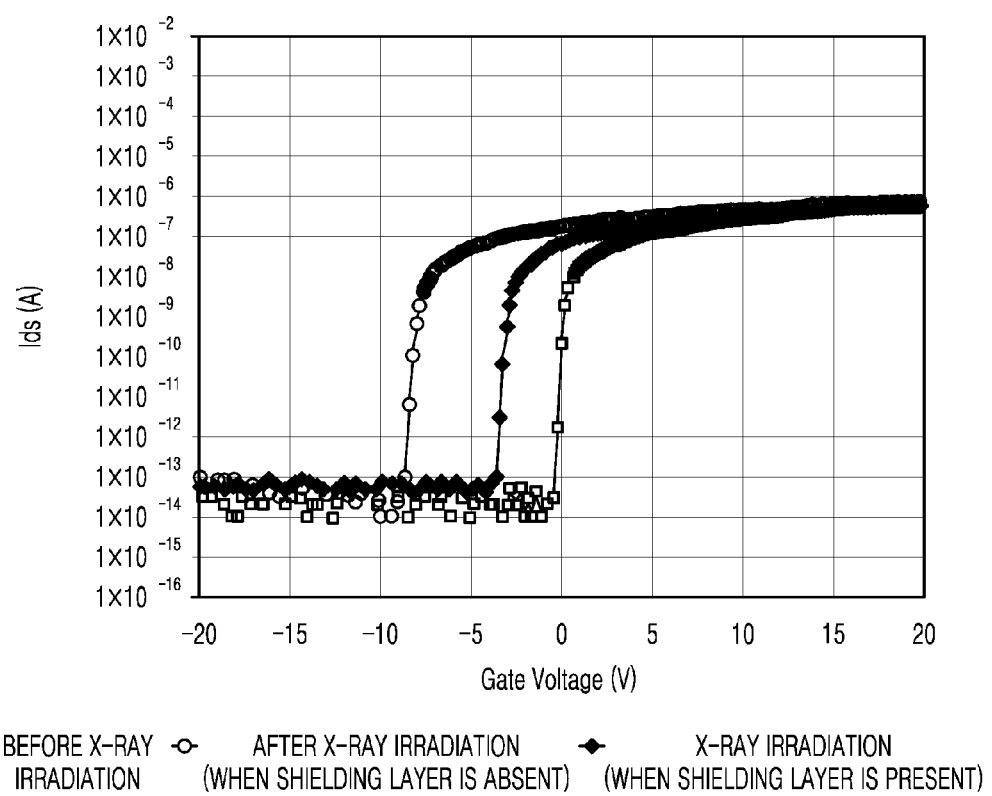
FIG. 6 shows a degree of occurrence of a negative shift of a threshold voltage before and after X-ray irradiation according to presence or absence of a shielding layer.

FIG. 6 shows a degree of occurrence of a negative shift of a threshold voltage before and after X-ray irradiation according to presence or absence of a shielding layer.

As shown in FIG. 6, almost no current flows at a (−) voltage before the X-ray irradiation.

In some examples, after the X-ray is irradiated in the absence of the shielding layer, a negative shift phenomenon of the threshold voltage is largely generated. In this example, a voltage of +0.76V is shifted to −8.7V, resulting in a negative shift by about 9.5V.

In some cases where a shielding layer is present in one aspect of the present disclosure, the voltage of +0.76V is shifted to −2.3V, resulting in a negative shift by about 3.0 V. The occurrence of the negative shift in the presence of the shielding layer is greatly reduced than the occurrence of the negative shift in the absence of the shielding layer.

According to the present disclosure, the thin film transistor array substrate for the digital X-ray detector device and the digital X-ray detector device include a base substrate, a plurality of data lines and a plurality of gate lines on the base substrate and arranged to cross each other, a driving thin film transistor on or above the base substrate and including the first electrode, the second electrode, the gate electrode, and the active layer, and the PIN diode connected to the driving thin film transistor.

In this case, one or more shielding layers are disposed above the driving thin film transistor to overlay the active layer and the one or more shielding layers are electrically connected to the data line.

A (+) voltage may be applied to the shielding layer electrically connected to the data line.

The gate electrode may be disposed below the active layer and the shielding layer may be disposed above the active layer. The at least one insulating layer may be disposed between among the plurality of shielding layers. Accordingly, the plurality of shielding layers are spaced apart from one another not to directly contact one another.

The shielding layer and the data line may be electrically connected to each other through the contact hole.

In this case, the shielding layer disposed closest to the driving thin film transistor may be electrically connected to the data line and the shielding layers may be electrically connected to one another.

The shielding layers may be electrically connected to one another through the contact hole in the insulating layer.

A first electrode of the driving thin film transistor may be electrically connected to the one or more shielding layers and the second electrode may be electrically connected to the PIN diode.

Although the present disclosure has been described with reference to the exemplary drawings, the present disclosure is not limited to the aspects and the drawings disclosed herein, and various modifications can be made by those skilled in the art within the scope of the technical idea of the present disclosure. Further, even if working effects obtained based on configurations of the present disclosure are not explicitly described in the description of aspects of the present disclosure, effects predictable based on the corresponding configuration have to be recognized

What is claimed is:

1. A thin film transistor array substrate for a digital X-ray detector device, comprising:
    a base substrate;
    a plurality of data lines and a plurality of gate lines disposed on the base substrate and arranged to cross each other;
    a driving thin film transistor disposed above the base substrate and including a first electrode, a second electrode, a gate electrode and an active layer; a PIN diode connected to the driving thin film transistor; and
    at least one shielding layers disposed above the driving thin film transistor and all outermost edges of the at least one shielding layers cover a top surface of the active layer, wherein the at least one shielding layers include a first shielding layer contacting the first electrode that is connected to the plurality of data lines, a second shielding layer overlapping with the first shielding layer and having a length shorter than the first shielding layer, and a third shielding layer overlapping with the second shielding layer and having a length shorter than the first shielding layer,
    wherein the at least one shielding layers are electrically connected to the plurality of data lines, and
    wherein a (+) voltage opposite to a negative shifting of a threshold voltage of the driving thin film transistor is applied to the at least one shielding layers electrically connected to the plurality of data lines
    to reduce the negative shifting of a threshold voltage of the driving thin film transistor when the X-ray is irradiated to and absorbed into the active layer.

2. The thin film transistor array substrate of claim 1, wherein the gate electrode is disposed below the active layer and the at least one shielding layers are disposed above the active layer.

3. The thin film transistor array substrate of claim 1, wherein the at least one shielding layers and the plurality of data lines are electrically connected to each other through contact holes.

4. The thin film transistor array substrate of claim 1, further comprising at least one insulating layer disposed on the at least one shielding layers that are spaced apart from one another.

5. The thin film transistor array substrate of claim 4, wherein the at least one shielding layers disposed closest to the driving thin film transistor are electrically connected to the plurality of data lines.

6. The thin film transistor array substrate of claim 4, wherein the at least one shielding layers are electrically connected to one another.

7. The thin film transistor array substrate of claim 6, wherein at least two shielding layers of the at least one shielding layers are electrically connected to one another through at least one contact hole in the at least one insulating layers.

8. The thin film transistor array substrate of claim 1, wherein the first electrode is electrically connected to the at least one shielding layers, and wherein the second electrode is electrically connected to the PIN diode.

9. A digital X-ray detector device, comprising:
    a thin film transistor array substrate;
    a plurality of data lines and a plurality of gate lines disposed on the thin film transistor array substrate and arranged to cross each other;
    a driving thin film transistor disposed above the thin film transistor array substrate and including a first electrode, a second electrode, a gate electrode and an active layer;
    a PIN diode connected to the driving thin film transistor; and
    at least one shielding layers disposed above the driving thin film transistor and all outermost edges of the at least one shielding layers cover a top surface of the active layer, wherein the at least one shielding layers include a first shielding layer contacting the first electrode that is connected to the plurality of data lines, a second shielding layer overlapping with the first shielding layer and having a length shorter than the first shielding layer, and a third shielding layer overlapping with the second shielding layer and having a length shorter than the first shielding layer,
    wherein a (+) voltage opposite to a negative shifting of a threshold voltage of the driving thin film transistor is applied to the at least one shielding layers electrically connected to the plurality of data lines
    to reduce the negative shifting of a threshold voltage of the driving thin film transistor when the X-ray is irradiated to and absorbed into the active layer; and
    a scintillator layer disposed on the thin film transistor array substrate for the digital X-ray detector device.

10. A thin film transistor array substrate for a digital X-ray detector device, comprising:
    a plurality of data lines disposed on the thin film transistor array substrate;

a driving thin film transistor disposed on the thin film transistor array substrate and including a first electrode, a second electrode, a gate electrode and an active layer, a PIN diode electrically connected to the driving thin film transistor; and first, second and third shielding layers disposed over the driving thin film transistor and overlaying the active layer to block direct absorption of the X-rays into the active layer, wherein all outermost edges of the first shielding layer cover a top surface of the active layer that faces an incoming direction of an X-ray, wherein the first shielding layer contacting the first electrode that is connected to the plurality of data lines, the second shielding layer overlapping with the first shielding layer and having a length shorter than the first shielding layer, and the third shielding layer overlapping with the second shielding layer and having a length shorter than the first shielding layer, wherein a (+) voltage opposite to a negative shifting of a threshold voltage of the driving thin film transistor is applied to the at least one shielding layers electrically connected to the plurality of data lines to reduce the negative shifting of a threshold voltage of the driving thin film transistor when the X-ray is irradiated to and absorbed into the active layer.

11. The thin film transistor array substrate of claim 10, wherein the gate electrode is disposed below the active layer and the first, second and third shielding layers are disposed above the active layer.

12. The thin film transistor array substrate of claim 10, further comprising at least one insulating layers disposed on the first, second and third shielding layers that are spaced apart from one another.

13. The thin film transistor array substrate of claim 10, wherein the first shielding layer is disposed closest to the driving thin film transistor and is electrically connected to the plurality of data lines.

14. The thin film transistor array substrate of claim 10, wherein each of the first, second and third shielding layers is supplied with a (+) voltage and electrically connected to the plurality of data lines.

15. The thin film transistor array substrate of claim 13, wherein the first, second and third shielding layers are electrically connected to one another.

16. The thin film transistor array substrate of claim 15, wherein at least two shielding layers of the first, second and third shielding layers are electrically connected to one another through at least one contact hole in the at least one insulating layers.

17. The thin film transistor array substrate of claim 10, wherein the first electrode is electrically connected to the first, second and third shielding layers.

18. The thin film transistor array substrate of claim 10, wherein the second electrode is electrically connected to the PIN diode.

19. The thin film transistor array substrate of claim 9, further comprising a planarization layer disposed above uppermost shielding layer of the shielding layers to overlay a whole surface of the thin film transistor array substrate, wherein the planarization layer has a flat surface, thereby the scintillator layer has a flat lower surface.

20. The thin film transistor array substrate of claim 10, further comprising;

a first passivation layer disposed above the active layer and on each of the first electrode, the second electrode;

the first shielding layer disposed on the first passivation layer;

a second passivation disposed above the PIN diode;

the second shielding layer disposed on the second passivation layer;

a third passivation layer disposed on the second shielding layer; and the third shielding layer disposed on the third passivation layer, wherein each of the first, second and third shielding layers overlaying the active layer to block direct absorption of the X-rays into the active layer, and wherein each of the first, second and third shielding layers have a greater area than that of the active layer.

* * * * *